(12) United States Patent
Bandyopadhyay

(10) Patent No.: US 11,038,515 B2
(45) Date of Patent: Jun. 15, 2021

(54) NOISE SHAPING ALGORITHMIC ANALOG-TO-DIGITAL CONVERTER

(71) Applicant: Analog Devices, Inc., Norwood, MA (US)

(72) Inventor: Abhishek Bandyopadhyay, Winchester, MA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 15/930,226

(22) Filed: May 12, 2020

(65) Prior Publication Data

US 2020/0366306 A1    Nov. 19, 2020

Related U.S. Application Data

(60) Provisional application No. 62/847,020, filed on May 13, 2019.

(51) Int. Cl.
| | |
|---|---|
| *H03M 1/06* | (2006.01) |
| *H03M 1/40* | (2006.01) |
| *H03M 1/44* | (2006.01) |

(52) U.S. Cl.
CPC ....... *H03M 1/0626* (2013.01); *H03M 1/0604* (2013.01); *H03M 1/40* (2013.01); *H03M 1/44* (2013.01)

(58) Field of Classification Search
CPC .... H03M 1/0626; H03M 1/0604; H03M 1/40; H03M 1/44
USPC ........................................ 341/161, 162, 155
See application file for complete search history.

(56) References Cited

U.S. PATENT DOCUMENTS

| | | | |
|---|---|---|---|
| 5,936,562 A | 4/1999 | Brooks et al. | |
| 6,127,958 A * | 10/2000 | Chang | H03M 1/162 341/155 |
| 6,195,032 B1 | 2/2001 | Watson et al. | |
| 6,348,888 B1 * | 2/2002 | Yu | H03M 1/0634 341/143 |
| 6,507,305 B2 | 1/2003 | Andre et al. | |
| 6,556,158 B2 | 4/2003 | Steensgaard-Madsen | |
| 6,803,870 B2 | 10/2004 | Kuttner | |
| 6,891,486 B1 | 5/2005 | Pentakota et al. | |
| 7,002,507 B2 | 2/2006 | Kobayashi et al. | |

(Continued)

OTHER PUBLICATIONS

Sarma et al., *A 250-MHz Pipelined ADC-Based fs/4 Noise-Shaping Bandpass ADC*, IEEE Transaction on Circuits and Systems—I: Regular Papers, vol. 65, No. 6, Jun. 2018, 10 pages.

(Continued)

*Primary Examiner* — Khai M Nguyen
(74) *Attorney, Agent, or Firm* — Patent Capital Group

(57) ABSTRACT

Disclosed herein are some examples of algorithmic analog-to-digital converters (AADCs) that perform noise shaping. In particular, an AADC disclosed herein includes circuitry that can store residue(s) of one or more conversion cycles produced by the AADC and apply a value corresponding to the residue(s) to a subsequent conversion cycle. The AADC may perform a filtering procedure with the residue(s) to produce the value applied to the subsequent conversion. Applying the value to the subsequent conversion cycle can increase a signal-to-noise ratio of the signal that the AADC is converting in the subsequent conversion cycle.

34 Claims, 4 Drawing Sheets

(56) References Cited

U.S. PATENT DOCUMENTS

| | | | |
|---|---|---|---|
| 7,068,202 B2* | 6/2006 | Waltari | H03M 1/1245 341/155 |
| 7,129,874 B2 | 10/2006 | Bjornsen | |
| 7,129,881 B2 | 10/2006 | Franz | |
| 8,482,449 B1 | 7/2013 | Zobroda | |
| 8,957,802 B1 | 2/2015 | Evans | |
| 8,994,572 B2* | 3/2015 | San | H03M 1/0692 341/163 |
| 10,536,161 B1 | 1/2020 | Zhang et al. | |
| 2007/0290914 A1 | 12/2007 | Matsushita et al. | |
| 2008/0062022 A1 | 3/2008 | Melanson | |
| 2009/0073016 A1 | 3/2009 | Fattaruso et al. | |
| 2014/0062736 A1 | 3/2014 | Nandi et al. | |
| 2015/0288380 A1 | 10/2015 | Zhao et al. | |
| 2016/0373101 A1 | 12/2016 | Dong et al. | |
| 2017/0353191 A1 | 12/2017 | Weng et al. | |

OTHER PUBLICATIONS

Bannon et al., *An 18 b 5 MS/s SAR ADC with 100.2 dB Dynamic Range*, 2014 Symposium on VLSI Circuits Digest of Technical Papers, © 2014 IEEE, 2 pages.

Krishnapura, *Pipelined Analog to Digital Converters*, Department of Electrical Engineering, Indian Institute of Technology, Madras, Chennai, India, Mar. 18, 2009, 55 pages.

Rajaee et al., *Highly Linear Noise-Shaped Pipelined ADC Utilizing a Relaxed Accuracy Front-End*, IEEE Journal of Solid-State Circuits, vol. 48, No. 2, Feb. 2013, 14 pages.

\* cited by examiner

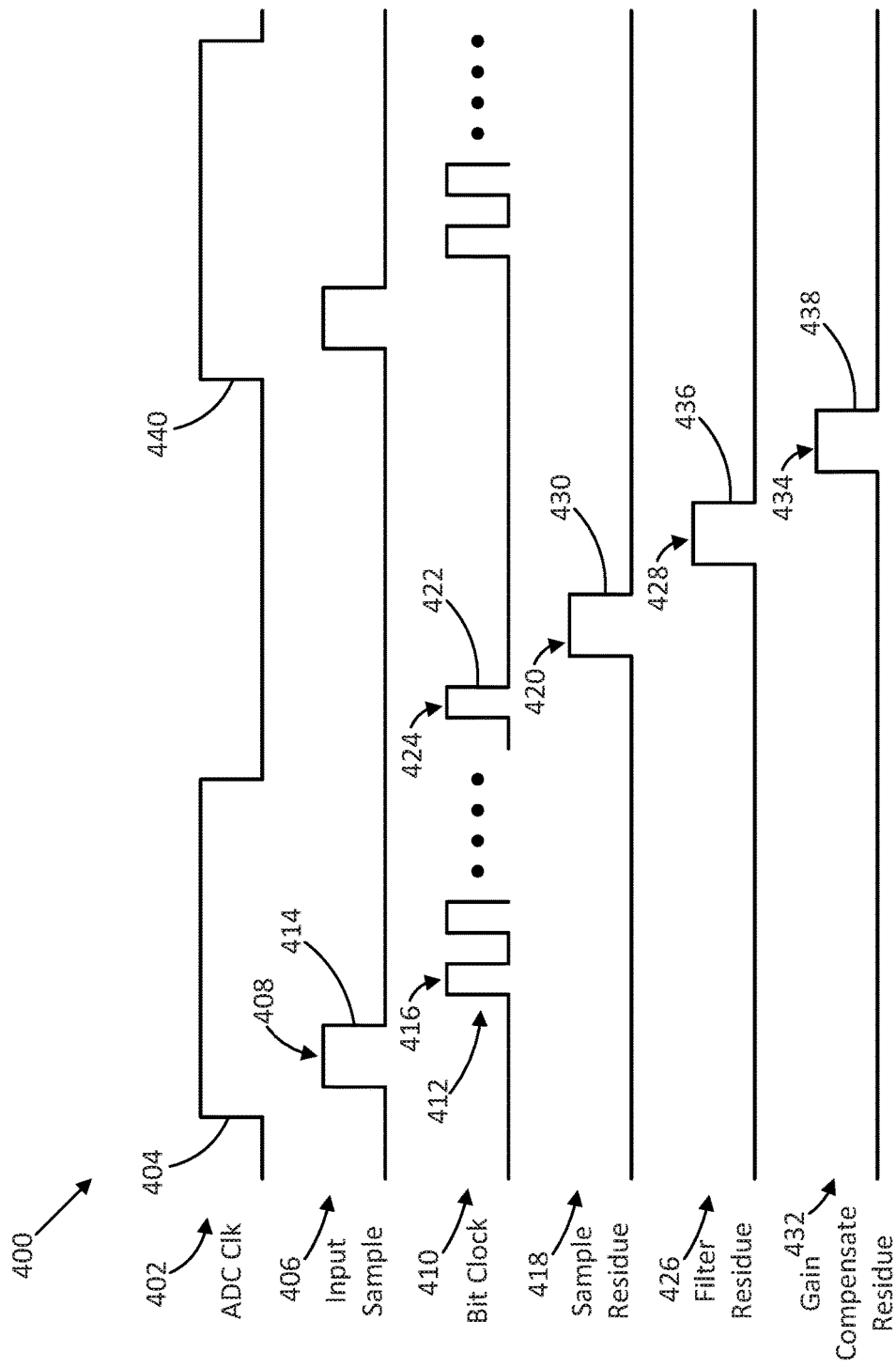

NOISE SHAPING ALGORITHMIC ANALOG-TO-DIGITAL CONVERTER

RELATED APPLICATIONS

The present disclosure claims priority to U.S. provisional application No. 62/847,020 entitled "NOISE SHAPING ALGORITHMIC ANALOG-TO-DIGITAL CONVERTER" and filed May 13, 2019, the disclosure of which is incorporated by reference in its entirety.

FIELD OF THE DISCLOSURE

This disclosure relates in general to the field of signal converters, and more particularly, though not exclusively, to a system and method for noise shaping for algorithmic analog-to-digital converters.

BACKGROUND

Legacy algorithmic analog-to-digital converters do not implement noise shaping. This lack of noise shaping can result in noise in a signal to be converted, which may result in lower bit resolution and/or bit resolution errors by the algorithmic analog-to-digital converters.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 4 illustrates an example timing chart for an AADC, according to various embodiments of the disclosure.

SUMMARY OF THE DISCLOSURE

Figure 1:
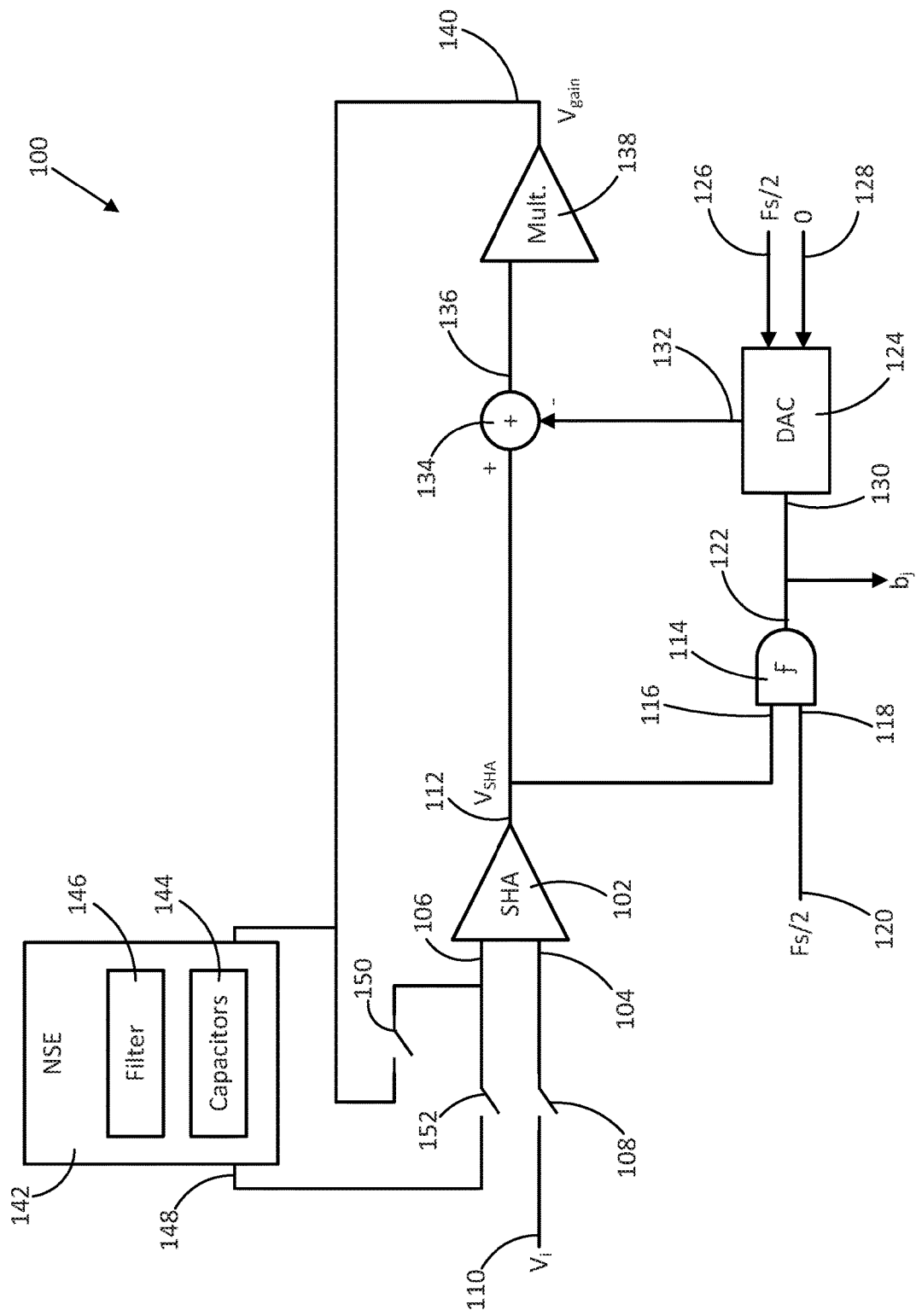
FIG. 1 illustrates an example algorithmic analog-to-digital converter (AADC) with noise shaping, according to various embodiments of the disclosure.

In an example, there is disclosed an algorithmic analog-to-digital converter with noise shaping capability. For example, the algorithmic analog-to-digital converter includes a noise shaping element that can store one or more residues of conversion cycles of the algorithmic analog-to-digital converter and performing a filtering operation on the one or more residues. The results of the filtering of the one or more residues can be applied to a subsequent conversion cycle to produce noise shaping.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

Disclosed herein are some examples of algorithmic analog-to-digital converters (AADCs) that perform noise shaping. In particular, an AADC disclosed herein includes circuitry that can store residue(s) of one or more conversion cycles produced by the AADC and apply a value corresponding to the residue(s) to a subsequent conversion cycle. The AADC may perform a filtering procedure with the residue(s) to produce the value applied to the subsequent conversion. Applying the value to the subsequent conversion cycle can increase a signal-to-noise ratio of the signal that the AADC is converting in the subsequent conversion cycle. All of the examples disclosed herein should be understood as non-limiting examples.

A system and method for noise shaping via an AADC will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral, while individual species or examples of the genus may be referred to by a numeral and letter combination.

FIG. 1 illustrates an example algorithmic analog-to-digital converter (AADC) 100 with noise shaping, according to various embodiments of the disclosure. In particular, the AADC 100 samples an analog signal and converts the analog signal to a digital signal in a conversion cycle by performing a plurality of bit trials to determine bit values of the digital signal. In performing the bit trials, the AADC 100 can produce a residue in a last bit trial of a conversion cycle and can apply a value corresponding to the residue to one or more subsequent conversion cycles for noise shaping.

The AADC 100 includes a sample-and-hold amplifier (SHA) 102. The SHA 102 can receive an analog value and store the analog value while bit trials are being performed by the AADC 100. Further, the SHA 102 may receive two analog values in some instances and sum the values to produce an analog value to be stored while the bit trials are being performed in some instances.

The SHA 102 has a first input 104 and a second input 106. The SHA 102 can sum the analog values received on the first input 104 and the second input 106. The first input 104 is coupled to a switch 108, which can couple the first input 104 to an input 110 of the AADC 100. In particular, the switch 108 couples the first input 104 to the input 110 of the AADC 100 when the switch 108 is closed and decouples the first input 104 from the input 110 of the AADC when the switch 108 is open. The SHA 102 further outputs the stored value on an output 112 of the SHA 102, where the stored value can be a value received on the first input 104, a value received on the second input 106, or a summation of values received on the first input 104 and the second input 106.

The AADC 100 further includes a comparator 114. The comparator 114 has a first input 116 and a second input 118.

The comparator 114 compares the values received on the first input 116 and the second input 118 and outputs a logical high value or a logical low value based on the comparison, wherein the logical high value corresponds to a binary 1 bit and the logical low value corresponds to a binary 0 bit. The first input 116 is coupled to the output 112 of the SHA and receives the stored value output by the SHA 102. The second input 118 is coupled to a comparison voltage source 120. The comparison voltage source 120 can provide a voltage level for comparison with the first input 116. In some embodiments, the comparison voltage source 120 comprises circuitry coupled to a voltage rail of the AADC 100, where the circuitry produces a voltage that is equal to half of the voltage of the voltage rail. In other embodiments, the comparison voltage source 120 may present a constant voltage representing half of the full scale voltage of the AADC 100, where the full scale may be equal to a difference between a maximum voltage and a minimum voltage of the AADC 100. The comparator 114 may compare the voltage provided by the comparison voltage source 120 with the voltage received via the output 112 of the SHA 102 and output, on an output 122 of the comparator 114, a logical high value or a logical low value based on the comparison. For example, the comparator 114 can output a logical high value if the voltage received via the output 112 exceeds the voltage of the comparison voltage source 120 and output a logical low value if the voltage received via the output 112 is less than the voltage of the comparison voltage source 120. The output 112 of the comparator 114 can provide a bit value of a bit trial of a conversion cycle.

The AADC 100 further includes a digital-to-analog converter (DAC) 124. The DAC 124 is coupled to the output 122 of the comparator 114 and receives the value output by the comparator 114 based on the comparison. The DAC 124 is further coupled to an analog conversion source 126 and a reference voltage 128 of the AADC 100. In some embodiments, the reference voltage 128 may be a ground voltage of the AADC 100 or some other fixed voltage. The analog conversion source 126 can provide a voltage level to which a logical high value of a digital signal will be converted. For example, the analog conversion source 126 comprises circuitry coupled to the voltage rail of the AADC, where the circuitry produces a voltage that is equal to half of the voltage of the voltage rail in some embodiments. Further, the analog conversion source 126 and the comparison voltage source 120 may be the same element in some embodiments. Based on whether the value received at an input 130 of the DAC 124 is a logical high value or a logical low value, the DAC 124 may output a voltage either equal to reference voltage 128 or the voltage of the analog conversion source 126 to an output 132 of the DAC 124. In particular, the DAC 124 may output a voltage equal to the voltage of the analog conversion source 126 if the value received at the input 130 is a logical high value and output a voltage equal to the reference voltage 128 if the value received at the input 130 is a logical low value.

The AADC 100 further includes a summation block 134. The summation block 134 is coupled to the output 112 of the SHA 102 and the output 132 of the DAC 124 and sums the values at the output 112 and at the output 132. In particular, the summation block 134 sums the value at the output 112 with an inverse of the value at the output 132. In other words, the summation block 134 subtracts the value at the output 132 from the output 112. The result of the summation is applied to an output 136 of the summation block 134.

The AADC 100 further includes a multiplier 138. The multiplier 138 is coupled to the output 136 of the summation block 134 and multiplies the value of a signal at the output 136. In some embodiments, the multiplier 138 can multiply the signal at the output 136 by a factor of 2. The multiplier 138 outputs the result of the multiplication on an output 140 of the multiplier 138. The value output by the multiplier 138 may be referred to as a residue of a bit trial. When the bit trial is a last bit trial of a conversion cycle, the value output by the multiplier 138 may further be referred to a residue of the conversion cycle.

The AADC 100 further includes a noise shaping element 142. The noise shaping element 142 is coupled to the output 140 of the multiplier 138. The noise shaping element 142 comprises circuitry that stores residue produced by the multiplier 138 and performs filtering of the residue to produce a signal for noise shaping of a signal received at an input 110 of the AADC 100.

The noise shaping element 142 includes one or more storage devices for storing residues produced by the multiplier 138. In the illustrated embodiment, the storage devices comprise one or more capacitors 144 utilized for storing the value of the residues produced by the multiplier 138. The storage devices can store one or more residues of conversion cycles, while residues of bit trials that are not residues of conversion cycles may not be stored in some embodiments.

The noise shaping element 142 further includes a filter 146. The filter 146 may retrieve the values of the residues from the storage device and perform some operation with the residues to produce a signal for noise shaping a signal received on the input 110 of the AADC 100. The operation performed by the filter 146 can be the same operation independent of the number of residues stored by the storage devices or may depend on the number of residues stored by the storage devices. For example, the filter 146 may perform a first order operation when one residue is stored by the storage devices, a second order operation when two residues are stored by the storage devices, and so forth in some embodiments. In some of these embodiments, the filter 146 can be configured to a maximum order operation, such that the filter 146 performs the maximum order operation in instances where the storage devices store a number of residues equal to or greater than the maximum order. For example, if the maximum order operation is configured to be a second order operation, the filter 146 will perform a second order operation in any instances where the storage devices have stored two or more residues. In other embodiments, the filter 146 can be configured to perform a certain order operation regardless of the number of residues stored by the storage device. For example, the filter 146 may perform a first order operation regardless of the number of residues stored by the storage devices.

For the filter 146, the order of the operation can define the number of residues utilized by the filtering operation. For example, a first order operation utilizes a single residue, the second order operation utilizes two residues, and so forth. Further, the filter 146 utilizes the most recently stored residues. For example, the first order operation utilizes the most recently stored residue, the second order operation utilizes the two most recently stored residues, and so forth.

In some embodiments, the filtering to be applied by the filter 146 can be defined as $1-(1-z^{-1})^x$, where x is the order of the shaping order to be applied. For example, the filtering to be applied can be defined by a filtering equation based on one or more captured residues from prior conversion cycles and weightings for the captured residues in some embodiments. A first order filtering to be applied by the filter 146 can be defined as Vgain(n−1)/A, where Vgain(Y) is the residue of conversion cycle Y, n is the conversion cycle to which the result of the filtering will be added to the input for noise shaping, and A is equal to 2 to the power of the number of bit trials within a conversion cycle. For the first order filtering, the Vgain(n−1) may be a captured residue from a conversion cycle prior to the conversion cycle to which the filtering is being applied and 1/A may be the weighting for the captured residue from the prior conversion cycle. A second order filtering to be applied by the filter 146 can be defined as 2*Vgain(n−1)/A−Vgain(n−2)/A. For the second order filtering, the Vgain(n−1) may be a captured residue from a conversion cycle prior to the conversion cycle to which the filtering is being applied, 2/A may be the weighting for the captured residue from the prior conversion cycle, Vgain(n−2) may be a captured residue from a conversion cycle two cycles prior to the conversion cycle to which the filtering is being applied, and the 1/A may be the weighing for the captured residue two cycles prior to the conversion cycle. The noise shaping element 142 outputs the results of the filtering operation to an output 148 of the noise shaping element 142. It should be understood that the filtering described herein is one example of filtering and other filtering techniques may be applied in other embodiments.

The AADC 100 further includes a switch 150. Switch 150 couples the output 140 of the multiplier 138 with the second input 106 of the SHA 102. When the switch 150 is closed, the output 140 of the multiplier 138 is coupled to the second input 106 of the SHA 102. When the switch 150 is open, the output 140 is decoupled from the SHA 102.

The AADC 100 further includes a switch 152. The switch 152 couples the output 148 of the noise shaping element 142 to the second input 106 of the SHA 102. When the switch 152 is closed, the output 148 of the noise shaping element 142 is coupled to the second input 106 of the SHA 102. When the switch 152 is open, the output 148 of the noise shaping element is decoupled from the second input 106 of the SHA 102.

A controller 308 (FIG. 3) can be coupled to the switch 108, the switch 150, and the switch 152. The controller 308 can control opening and closing of the switch 108, the switch 150, and the switch 152. To perform sampling of a signal on the input 110 without performing noise shaping (which can be performed in instances where the noise shaping element 142 does not have residues stored or noise shaping is not desired), the controller 308 can cause the switch 108 to be closed while causing the switch 150 and the switch 152 to be open, thereby coupling the input 110 to the first input 104 of the SHA 102. Once the signal has been sampled, the controller 308 can cause the switch 150 to be closed while causing the switch 108 and the switch 152 to be open, thereby coupling the output 140 of the multiplier 138 to the second input 106 of the SHA 102. The controller 308 may maintain the switch 150 closed, and the switch 108 and the switch 152 open for the duration of the conversion cycle of the sample while bit trials are being performed. The controller 308 may further be coupled to the noise shaping element 142 and may cause the noise shaping element 142 to store the residues of each of the bit trials and/or the residue of the last bit trial within the conversion cycle. The AADC 100 can output bits resulting from each bit trial on the output 122, where the bits can be provided to a storage device 310 (FIG. 3) that stores the bits as a binary number that is a digital value resulting from the conversion of the sample.

To perform sampling of a signal on the input 110 and apply noise shaping, the controller 308 can cause the switch 108 and the switch 152 to be closed while causing the switch 150 to be open, thereby coupling the input 110 to the first input 104 of the SHA 102 and the output 148 of the noise shaping element 142 to the second input 106 of the SHA 102. The SHA 102 sums the signals received on the first input 104 and the second input 106 to produce the noise shaping and output the result on the output 112. The result of a first order noise shaping with first order filtering performed by the noise shaping element 142 can be defined by the equation Vin(n)+Vgain(n−1)/A, where Vin(n) is the signal on the input 110 for the conversion cycle to be performed, Vgain(n−1) is the residue of the previous conversion cycle, and A=2^(number of bit trials in a conversion cycle or effective number of bit trials in a conversion cycle), where A may refer to a gain factor. The gain factor can be related to an effective number of bit trials in a conversion cycle, or can be another scaling factor. The result of a second order noise shaping with second order filtering performed by the noise shaping element 142 can be defined by the equation Vin(n)+2*Vgain(n−1)/A−Vgain(n−2)/A, wherein Vin(n) is the signal on the input 110 for the conversion cycle to be performed, Vgain(n−1) is the residue of the previous conversion cycle, Vgain(n−2) is the residue for the conversion cycle completed two conversion cycles prior to the current conversion cycle, and A=2^(number of bit trials in a conversion cycle or effective number of bit trials in a conversion cycle). Once the signal with noise shaping has been produced, the controller 308 can cause the switch 150 to be closed while causing the switch 108 and the switch 152 to be open, thereby coupling the output 140 of the multiplier 138 to the second input 106 of the SHA 102. The controller 308 may maintain the switch 150 closed, and the switch 108 and the switch 152 open for the duration of the conversion cycle of the sample while bit trials are being performed. The controller 308 may further be coupled to the noise shaping element 142 and may cause the noise shaping element 142 to store the residues of each of the bit trials and/or the residue of the last bit trial within the conversion cycle. The AADC 100 can output bits resulting from each bit trial on the output 122, where the bits can be provided to a storage device 310 that stores the bits as a binary number that is a digital value resulting from the conversion of the sample.

In the illustrated embodiment, the AADC 100 is illustrated with a single line with the switch 152 coupling the output 148 of the noise shaping element 142 to the SHA 102. In some of these embodiments, the noise shaping element 142 may combine the filtered residues produced by the filter 146 and provide each of the filtered residues to the SHA 106 as the combined filtered residues. In other of these embodiments, the noise shaping element 142 may utilize a time-based technique to transmit each of the filtered residues (such as transmitting each of the filtered residues at different times) to the SHA 102 and the SHA 102 may combine the filtered residues received from the noise shaping element 142. In other embodiments of the AADC 100, multiple lines may couple outputs of the noise shaping element 142 to the SHA 102, where the outputs may include switches that operate similar to the switch 152, and each of the outputs may be utilized for transmitting a corresponding filtered residue of the filtered residues to the SHA 102. The SHA 102 may combine the filtered residues received from the noise shaping element 142 via the multiple lines.

Figure 2:
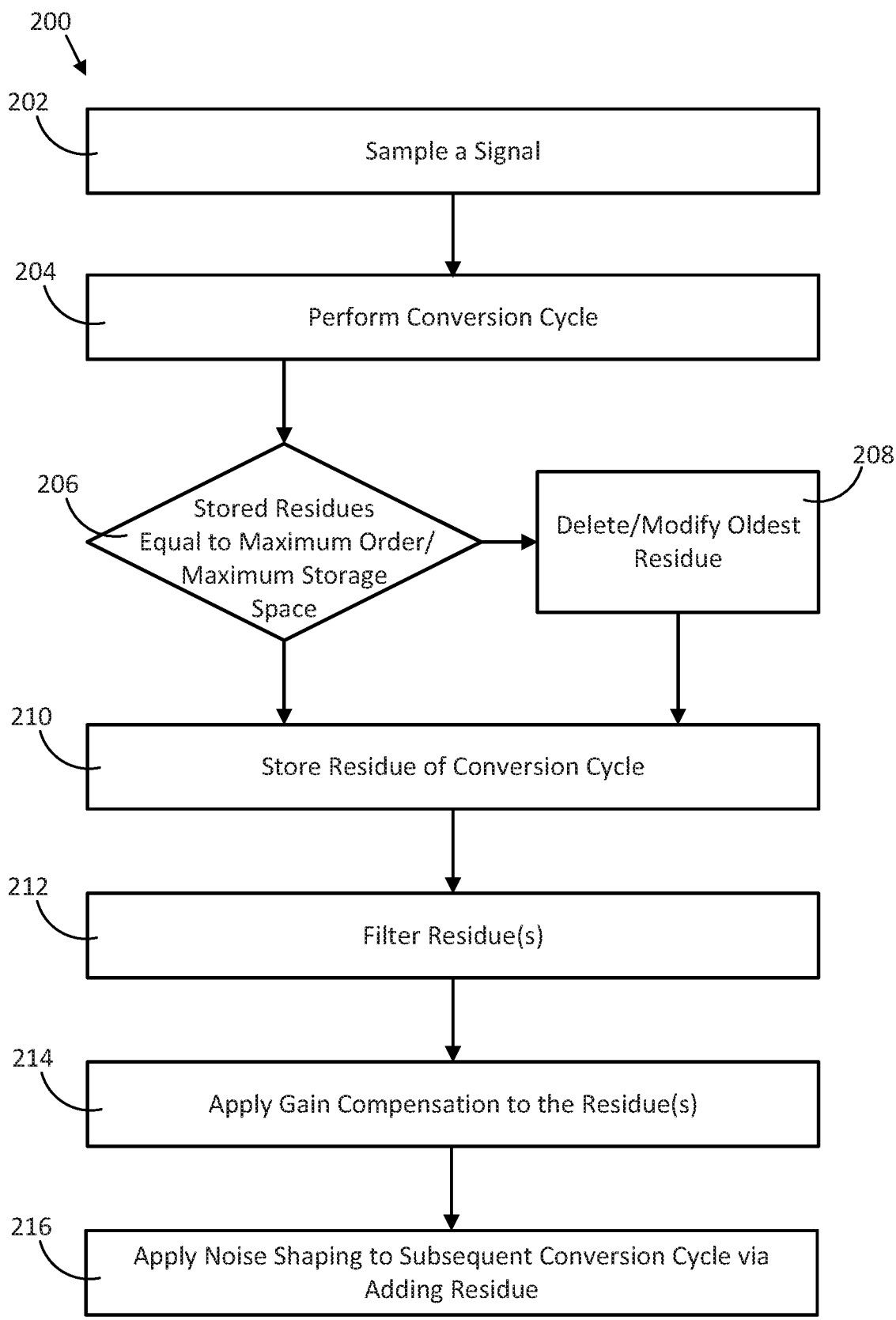
FIG. 2 illustrates an example procedure for noise shaping by an AADC, according to various embodiments of the disclosure.

FIG. 2 illustrates an example procedure 200 for noise shaping by an AADC, according to various embodiments of the disclosure. For example, the procedure 200 can be implemented by the AADC 100 (FIG. 1).

In 202, the AADC can sample an input signal received by the AADC to produce sample for conversion. For example, the AADC may receive a signal at an input and may determine a value of the signal at a particular time to produce a sample. In particular, the AADC (such as the AADC 100) may receive a signal via an input (such as the input 110 (FIG. 1)) of the AADC and may sample the signal via a switch (such as the switch 108 (FIG. 1)) and an SHA (such as the SHA 102 (FIG. 1)).

In 204, the AADC can perform a conversion cycle on the sample produced by sampling the signal in 202. In particular, the AADC can perform one or more bit trials to convert the sample to a digital value. In instances where residues from prior conversion cycles have been stored, the AADC can utilize one or more of the stored residues to perform noise shaping of the sample for the conversion of the signal. In particular, a noise shaping element (such as the noise shaping element 142 (FIG. 1)) can perform filtering with the stored residues and an SHA (such as the SHA 102) can sum the results of the filtering with the sample. The AADC can then perform one or more bit trials to convert the value resulting from the summation of the results of the filtering with the sample to convert the sample to a digital value.

Referring to FIG. 1, performing the conversion cycling can include the controller 308 (FIG. 3) causing the switch 108 (FIG. 1) to close for sampling of the analog signal on the input 110 (FIG. 1) of the AADC 100 (FIG. 1). In instances where noise shaping is performed, performing the conversion cycle can include the controller 308 causing the switch 108 and the switch 108 and the switch 152 to close for sampling of the analog signal on the input 110 and applying the noise shaping. Once the sampling of the analog signal, and the noise shaping in applicable instances, has been completed, the controller 308 can cause the switch 150 (FIG. 1) to be closed, and the switch 108 and the switch 152 to be opened, to perform the bit trials for the conversion cycle.

In 206, the AADC can determine whether a number of residues currently stored by the noise shaping element is equal to (or exceeds) a maximum filter order or a maximum number of residues that can be stored by the noise shaping element depending on the embodiment. In particular, the AADC can determine whether a storage device (such as the capacitors 144 (FIG. 1)) of the noise shaping element has a number of residues currently stored that is equal to (or that exceeds) a maximum filter order or a maximum number of residues that can be stored by the storage device. In some embodiments, the AADC can determine whether the number of residues currently stored is equal to (or exceeds) the maximum filter order, while the AADC can determine whether the number of residues currently stored is equal to (or exceeds) the maximum number of residues that can be stored in other embodiments. If AADC determines that the number of residues currently stored by the noise shaping element is equal to (or exceeds) the maximum filter order or the maximum number of residues depending on the embodiment, the procedure 200 can proceed to 208. If the AADC determines that the number of residues currently stored by the noise shaping element is less than the maximum filter order or the maximum number of residues depending on the embodiment, the procedure 200 can proceed to 210. In some embodiments, 206 can be omitted.

In 208, the AADC can delete, modify, or overwrite the oldest residue from the storage device of the noise shaping element. In particular, in response to determining that the number of residues currently stored is equal to (or exceeds) a maximum filter order or a maximum number of residues that can be stored by the storage device, the noise shaping element may remove the oldest residue from storage. The oldest residue can be a stored residue of a prior conversion cycle that is furthest in time of the stored residues from the current conversion cycle. Once the oldest residue has been deleted, the procedure 200 can proceed to 210. In some embodiments, 208 can be omitted. In other embodiments, the oldest residue may be modified in response to determining the number of residues stored is equal to (or exceeds) the maximum filter order or the maximum number of residues that can be stored by the storage device. For example, the oldest residue may be modified based on one or more of the newer residues produced by the AADC. In other embodiments, any of the residues can be modified at any time.

In 210, the residue of the current conversion cycle can be stored. In particular, the residue can be stored in a storage device of the noise shaping element (such as the capacitors 144). The residue can be the residue at an output of the AADC produced in response to the last bit trial of the conversion cycle. The residue can be stored in the noise shaping element with residue from other, prior conversion cycles, where the residue can be stored along with an indication of the order in which the residues were stored. The indication can include a location in which the residue is stored and/or a value stored and associated with the residue that indicates an order in which the residues were stored. Referring to FIG. 1, storing the residue of the current conversion cycle can include storing the value on the output 140 (FIG. 1), produced in response to the last bit trial of the conversion cycle, in the storage device (i.e., the capacitors 144) of the noise shaping element 142.

In 212, a filter operation can be applied to the residues. In particular, a filtering operation can be applied to one or more of the residues stored by the noise shaping element depending on the number of residues currently stored by the noise shaping element and/or the predefined order of the noise shaping to be applied. The filtering operation can be applied to a number of residues equal to the order of the noise shaping to be applied, where the residues utilized are the most recently stored residues. For example, a filter (such as the filter 146 (FIG. 1)) of the noise shaping element can apply a first order filtering operation, a second order filtering operation, or another high order filtering operation (as described in relation to FIG. 1) to the most recently stored residues in the storage device of the noise shaping element equal to the order number.

In 214, gain compensation can be applied to the residues. In particular, gain compensation may be applied to the filtered residues produced in 212. For example, for a first order noise shaping the most recent residue may be divided by A, where A=2^(number of bit trials in a conversion cycle or effective number of bit trials in a conversion cycle) to produce the gain for noise shaping. The gain compensation may have different weightings for different residues based on a relationship in time for each of the residues to the conversion cycle to which noise shaping is being applied. For example, for a second order noise the most recent residue may be multiplied by 2 and divided by A and residue just prior to the most recent residue may be divided by A, where A=2^(number of bit trials in a conversion cycle or effective number of bit trials in a conversion cycle). In particular, the most recent residue may have gain compensation weighting of 2 by which the residue is multiplied and the residue just prior to the most recent residue may have a gain compensation weighting of 1 in the described situation. The weighting of the gain compensation may be dependent on an effective number of bit trials within a conversion cycle in some embodiments. The result of operation performed on the prior residue may be subtracted from the result of the operation of the most recent residue to produce the gain for noise shaping.

In 216, noise shaping can be applied to a subsequent conversion cycle. In particular, the result of gains computed in 214 can be added to a subsequent sample, sampled subsequent to the sampling of the signal in 204, of an analog signal received on the input of the AADC at an initiation of the subsequent conversion cycle to noise shape the sample. Referring to FIG. 1, the noise shaping can be performed by the controller 308 causing the switch 108 and the switch 152 to be closed at the initiation of the conversion cycle, where the SHA 102 (FIG. 1) sums the sample received via the first input 104 (FIG. 1) and the result of the filtering of the residues received via the second input 106 (FIG. 1).

Figure 3:
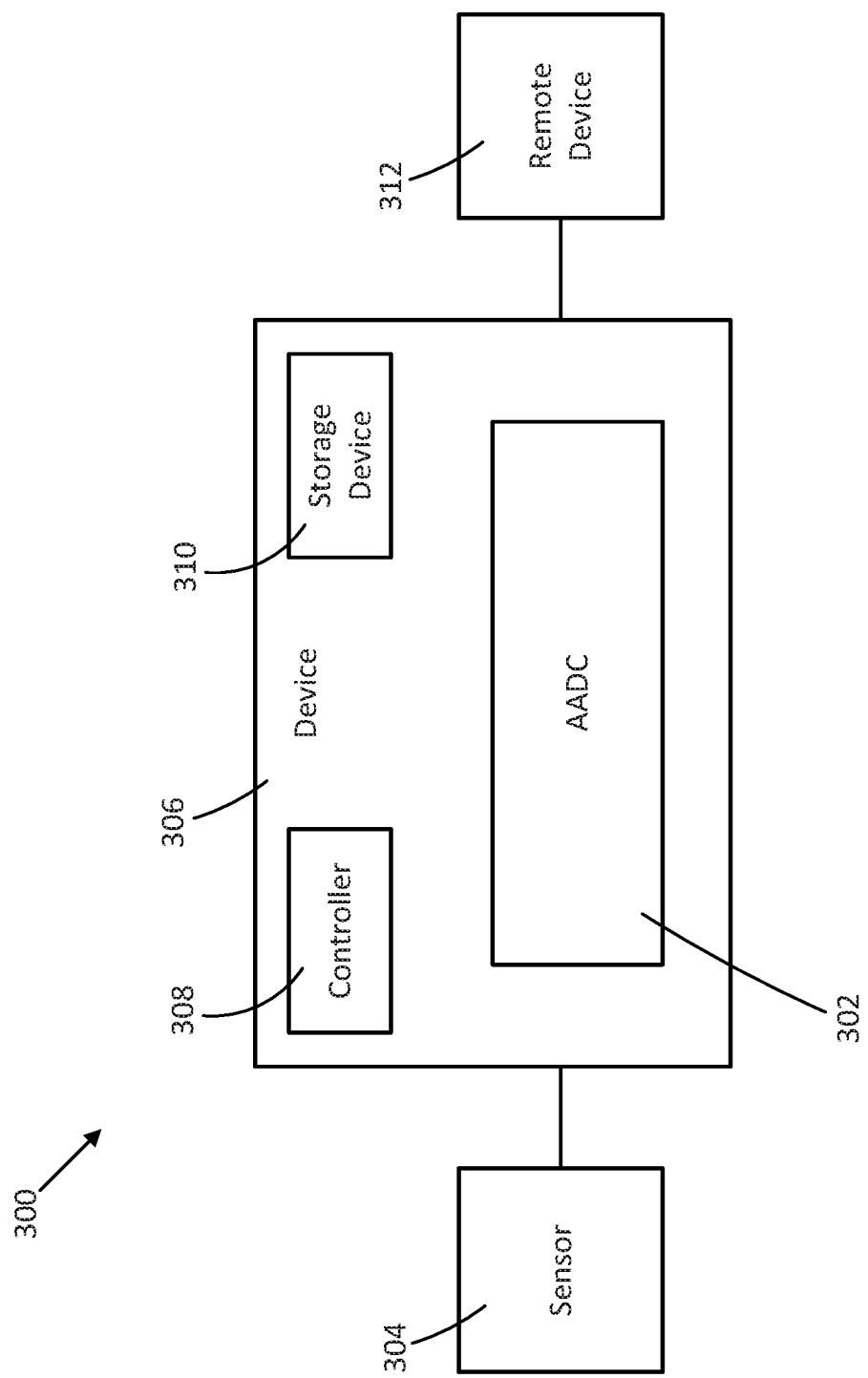
FIG. 3 illustrates an example system having an AADC with noise shaping, according to various embodiments of the disclosure.

FIG. 3 illustrates an example system 300 having an AADC 302 with noise shaping, according to various embodiments of the disclosure. In particular, the system 300 can implement the AADC 100 (FIG. 1) as the AADC 302. In some embodiments, the system 300 may comprise a sensing device, such as a low-power sensing device.

The system 300 includes a sensor 304. The sensor 304 senses some characteristic and outputs an analog signal that indicates a value of the characteristic. For example, some characteristics that the sensor 304 may be configured to sense includes temperature, force, sound, and/or light. It is to be understood that the characteristics listed are intended to be non-limiting and other characteristics can be sensed by the sensor 304 in other implementations.

The system 300 further includes a device 306. The device 306 is coupled to the sensor 304. The device 306 manages communication with the sensor 304 and converts the analog signal produced by the sensor 304 to a digital signal for transmission and/or processing. The device 306 includes the AADC 302. The AADC 302 includes one or more of the features of the AADC 100. The AADC 302 can receive the analog signal from the sensor 304 and produce a digital signal from the analog signal.

The device 306 further includes a controller 308. The controller 308 can control communication with the device 306, such as receiving the analog signal from the sensor 304 and providing the digital signal produced by the AADC 302 to other devices. The controller 308 can further control conversion by the AADC 302, such as controlling the analog signal being provided to the AADC 302, controlling activation of switches (such as the switch 108 (FIG. 1), the switch 150 (FIG. 1), and/or the switch 152 (FIG. 1)) of the AADC 302, controlling some operations of a noise shaping element (such as the noise shaping element 142 (FIG. 1)) of the AADC 302, or some combination thereof. The controller 308 may comprise a system-on-chip, a processor, circuitry, or some combination thereof. In some embodiments, the controller 308 can include or can interact with communication circuitry (such as wireless communication circuitry and/or wired communication circuitry) to facilitate communication with the device 306.

The device 306 can further include a storage device 310. The storage device 310 can be coupled to a binary output (such as the output 122 (FIG. 1)) of the AADC 302 and may receive bit values output by the binary output and store the bit values as a binary value corresponding to a sample of the analog signal received by the AADC 302. The storage device 310 can store a plurality of binary values that comprise a digital signal resulting from the conversion of the analog signal via the AADC 302. The system 300 further includes a remote device 312. The remote device 312 is coupled to the device 306. The remote device 312 can receive the digital signal produced by the AADC 302 and/or the storage device 310 from the device 306, and perform digital signal processing and/or analyze the digital signal. In some embodiments, the remote device 312 may comprise a computer device with a processor and can process the digital signal received from the device 306.

While the sensor 304, the device 306, and the remote device 312 are illustrated as three separate devices in the illustrated embodiment, it is to be understood that one or more of the sensor 304, the device 306, and the remote device 312 may be included within a single device in other embodiments. For example, the sensor 304 and the device 306 may be included within a single device in some embodiments, such as being included within a probe. Further, the device 306 and the remote device 312 may be included in a single device in other embodiments. Additionally, the sensor 304, the device 306, and the remote device 312 may be included in a single, stand-alone device in other embodiments, such as being included within a smart phone.

FIG. 4 illustrates an example timing chart 400 for an AADC, according to various embodiments of the disclosure. In particular, the timing chart 400 illustrates timing for a noise shaping procedure performed by an AADC according to some embodiments. The AADC may comprise the AADC 100 (FIG. 1) or the AADC 302 (FIG. 3).

The timing chart 400 illustrates an analog-to-digital converter (ADC) clock 402. The ADC clock 402 can be utilized to initiate a conversion cycle to be performed by the AADC. The conversion cycle can be initiated in response to a leading edge 404 of the ADC clock 402. In the illustrated embodiment, the leading edge 404 is a rising edge of the ADC clock 402. In other embodiments, the leading edge 404 may be a falling edge of the ADC clock 402.

The timing chart 400 further illustrates an input sample timing 406. The input sample timing 406 may indicate when a sample value is captured from the input of the AADC. For example, the sample value may be captured by the AADC 100 from the input 110 (FIG. 1) of the AADC 100. The input sample timing 406 may include a capture time 408 where the signal of the input sample timing 406 goes high. In other embodiments, the signal may go low during the capture time 408. The AADC can capture a value of a signal on the input of the AADC and store the value for conversion. The signal illustrated within the timing chart 400 may be utilized for controlling switches utilized for sampling and/or noise shaping in an AADC, such as the switch 108 (FIG. 1) and/or the switch 152 (FIG. 1) of the AADC 100.

The timing chart 400 further includes a bit clock 410. The bit clock 410 can include one or more steps, where the bit clock 410 goes high during the steps. In other embodiments, the bit clock 410 may go low during the steps in other embodiments. In the illustrated embodiment, the bit clock 410 includes a plurality of steps 412, where each step in the plurality of steps 412 indicates a determination of a bit in the conversion of the sampled value. The number of steps in the plurality of steps 412 corresponds to at least the number of bits to which the sampled value is to be converted (for example, if the sampled value is to be converted to a 7-bit value, the plurality of steps 412 can include at least 7 steps). Initiation of the plurality of steps 412 can occur in response to a falling edge 414 of the signal of the input sample timing 406, where the falling edge 414 indicates that the sample has been captured. In other embodiments, a rising edge of the signal of the input sample timing 406 may indicate that the sample has been captured and the plurality of steps can be initiated in response to the rising edge. In particular, a first step 416 of the plurality of steps 412 may be initiated in response to the falling edge 414, where the first step 416 corresponds to a conversion of a first bit.

The timing chart 400 further includes a residue sample timing 418. The residue sample timing 418 indicates when a residue of the sampled value is captured. The residue sample timing 418 may include a capture time 420, where the signal of the residue sample timing 418 goes high during the capture time 420. In other embodiments, the signal of the residue sample timing 418 may go low during the capture time 420. The AADC may sample the residue during the capture time. In particular, the AADC may sample an output value of the AADC remaining after the conversion of sample has been completed (i.e., the residue). The capture time 420 may be initiated in response to a falling edge 422 of a last step 424 of the plurality of steps 412.

The timing chart 400 further includes a residue filter timing 426. The residue filter timing 426 indicates when filtering is applied to the residue. The residue filter timing may include a filter time 428, where a signal of the residue filter timing 426 goes high during the filter time 428. In other embodiments, the signal of the residue filter timing 426 may go low during the filter time 428. The AADC may apply filtering to the residue during the filter time 428. The filter time 428 may be initiated in response to completion of the capture time 420, which may be indicated by a falling edge 430 of the signal of the residue sample timing 418.

The timing chart 400 further includes a gain compensate residue timing 432. The gain compensate residue timing 432 indicates when gain compensation is applied to the filtered residue. The gain compensate residue timing 432 may include a gain time 434, where a signal of the gain compensate residue timing 432 goes high during the gain time 434. In other embodiments, the signal of the gain compensate residue timing 432 may go low during the gain time 434. The AADC may apply gain compensation to the filtered residue during the gain time 434. The gain time 434 may be initiated in response to the completion of the filter time 428, which may be indicated by a falling edge 436 of the signal of the residue filter timing 426. It should be understood that the gain compensation may be applied to the filtered residue at different times, and/or in conjunction with other operations, than illustrated by the gain compensate residue timing 432 illustrated in the timing chart 400. For example, the gain compensation may be performed while the residue is being sampled (as represented by the residue sample timing 418), or while the filtering of the residue is being performed (as represented by the residue filter timing 426). In other embodiments, the gain compensation may occur before or after the time the residue is being sampled (as represented by the residue sample timing 418), or before or after the time that the filtering of the residue is being performed (as represented by the residue filter timing 426).

The AADC may initiate another conversion cycle in response to the completion of the gain time 434, as indicated by a falling edge 438 of the signal of the gain compensate residue timing 432. The ADC clock 402 illustrates a second leading edge 440, which indicates an initiation of a second conversion cycle. The second conversion cycle may proceed the same as the first conversion cycle. For example, the AADC may sample a signal on an input of the AADC in response to the second conversion cycle being initiated, determine the bits for the conversion, sample the residue, apply filtering to the residue, and apply gain compensation to the residue.

EXAMPLES

The following examples are provided by way of illustration.

Example 1 may include an algorithmic analog-to-digital converter (AADC), comprising a sample-and-hold amplifier (SHA) to sample an analog signal input into the AADC to produce a sample of the analog signal, a comparator to perform a first conversion cycle of the sample, and a noise shaping element (NSE) to receive a residue of the first conversion cycle, and provide the residue to the SHA, the SHA to utilize the residue in performance of a second conversion cycle, the second conversion cycle being subsequent to the first conversion cycle.

Example 2 may include the AADC of example 1, wherein the NSE includes: a storage device to store the residue, and a filter to filter the residue to be provided to the SHA, wherein the residue to be provided to the SHA is the filtered residue.

Example 3 may include the AADC of example 2, wherein to filter the residue includes to apply a filtering equation for the residue, wherein the filtering equation is based on the residue and a weighting for the residue.

Example 4 may include the AADC of example 1, wherein the residue is a first residue, the NSE is further to provide a second residue to the SHA during the second conversion cycle, the second residue of a third conversion cycle, the third conversion cycle being prior to the first conversion cycle, and wherein the SHA is further to utilize the second residue in the performance of the second conversion cycle.

Example 5 may include the AADC of example 4, wherein the NSE includes a storage device to store the first residue and the second residue, and a filter to filter the first residue and the second residue to be provided to the SHA, wherein to filter the first residue includes to apply a first filtering equation for the first residue, wherein the first filtering equation is based on the first residue and a first weighting for the first residue, wherein to filter the second residue includes to apply a second filtering equation for the second residue, wherein the second filtering equation is based on the second residue and a second weighting for the second residue, wherein the second weighting is different than the first weighting, and wherein the first residue provided to the SHA is the filtered first residue and the second residue provided to the SHA is the filtered second residue.

Example 6 may include the AADC of example 1, further comprising a multiplier to receive the residue, and multiply the residue, wherein the residue to be received by the NSE is the multiplied residue.

Example 7 may include the AADC of example 1, wherein the comparator is to output a digital representation of the sample, and wherein the AADC further comprises a digital-to-analog converter (DAC) to produce an analog representation of the digital representation of the sample, and a summation block to subtract the analog representation from the sample to produce the residue.

Example 8 may include the AADC of example 1, wherein the SHA has a first input and a second input, wherein the AADC further includes a first switch coupled between the first input of the SHA and an input of the AADC on which the analog signal is received, wherein the first switch is to be closed to sample the analog signal, and a second switch coupled between the NSE and the second input of the SHA, wherein the second switch is to be closed to provide the residue to the SHA.

Example 9 may include a method of noise shaping by an algorithmic analog-to-digital converter (AADC), comprising performing, by the AADC, a first conversion cycle for a first sample of an analog input signal, storing, by the AADC, a residue from the first conversion cycle, and applying, by the AADC, the residue as noise shaping for a second conversion cycle for a second sample of the analog input signal.

Example 10 may include the method of example 9, further comprising filtering, by the AADC, the residue, wherein the residue applied by the AADC is the filtered residue.

Example 11 may include the method of example 9, further comprising applying, by the AADC, gain compensation to the residue to be applied by the AADC, wherein a weighting of the gain compensation is dependent on a number of bit trials within the first conversion cycle.

Example 12 may include the method of example 9, further comprising determining, by the AADC, whether a number of residues stored by the AADC is equal to a maximum number of residues to be stored by AADC, and deleting or modifying, by the AADC, a second residue from the AADC in response to a determination that the number of residues stored by the AADC is equal to the maximum number of residues, wherein the second residue is an oldest residue stored by the AADC.

Example 13 may include the method of example 9, wherein the residue is a first residue, wherein method further comprises applying, by the AADC, a second residue as the noise shaping for the second conversion cycle, wherein the second residue is from a third conversion cycle, and wherein the third conversion cycle was performed prior to the first conversion cycle.

Example 14 may include the method of example 13, further comprising applying, by the AADC, first gain compensation to the first residue to be applied as the noise shaping, wherein a first weighting of the first gain compensation is applied to the first residue, and applying, by the AADC, second gain compensation to the second residue to be applied as the noise shaping, wherein a second weighting of the second gain compensation is applied to the second residue, and wherein the second weighting is different than the first weighting.

Example 15 may include the method of example 13, wherein the first residue is a most recently stored residue prior to the second conversion cycle, and wherein the second residue is a second most recently stored residue prior to the second conversion cycle.

Example 16 may include a sensing device, comprising a sensor to sense a characteristic and output an analog signal that indicates a value of the characteristic, and a device coupled to the sensor, the device to sample the analog signal to produce a first sample, and perform an analog-to-digital conversion of the first sample with an algorithmic analog-to-digital converter (AADC) of the device, wherein to perform the analog-to-digital conversion includes to utilize a residue of a prior conversion cycle to provide noise shaping for the analog-to-digital conversion of the first sample.

Example 17 may include the sensing device of example 16, wherein the device includes a controller coupled to the AADC, wherein the controller is to cause a first switch of the AADC to couple an input of the device to the AADC to sample the analog signal, and cause a second switch of the AADC to close to provide the residue for the noise shaping.

Example 18 may include the sensing device of example 16, wherein the residue is a first residue, wherein the AADC includes a storage device to store one or more residues from one or more conversion cycles prior to the analog-to-digital conversion of the first sample, wherein the one or more residues includes the first residue, and a filter to filter the one or more residues, wherein the filtered one or more residues are to be utilized to provide the noise shaping for the analog-to-digital conversion of the first sample.

Example 19 may include the sensing device of example 18, wherein to filter the one or more residues include to apply a compensation gain to the one or more residues, wherein the compensation gain includes to apply different weightings to each of the one or more residues based on numbers of conversion cycles each of the one or more residues is from the analog-to-digital conversion of the first sample.

Example 20 may include the sensing device of example 18, wherein the AADC is to compare a number of the one or more residues to a maximum number of residues, and remove an oldest residue of the one or more residues from the storage device in response to the number of the one or more residues is equal to the maximum number of residues.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES may be applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data. Certain embodiments can relate to multi-DSP, multi-ASIC, or multi-SoC signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include, for example, pulmonary monitors, accelerometers, heart rate monitors, or pacemakers, along with peripherals therefor. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion, rendering, and display products in battery monitoring, control systems, reporting controls, maintenance activities, and others. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The particular embodiments of the present disclosure may readily include a system-on-chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In some cases, the teachings of the present specification may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the buffers, clocks, converters, amplifiers, switches, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications.

What is claimed is:

1. An algorithmic analog-to-digital converter (AADC), comprising:
  a sample-and-hold amplifier (SHA) to sample an analog signal at an input into the AADC to produce a sample of the analog signal;
  a comparator to perform a first conversion cycle of the sample; and
  a noise shaping element (NSE) to:
    receive a residue of the first conversion cycle; and
    provide the residue to the SHA, the SHA to utilize the residue in performance of a second conversion cycle, the second conversion cycle being subsequent to the first conversion cycle.

2. The AADC of claim 1, wherein the NSE includes:
  a storage device to store the residue; and
  a filter to filter the residue to be provided to the SHA, wherein the residue to be provided to the SHA is the filtered residue.

3. The AADC of claim 2, wherein to filter the residue includes to apply a filtering equation for the residue, wherein the filtering equation is based on the residue and a weighting for the residue.

4. The AADC of claim 1, wherein the residue is a first residue, the NSE is further to provide a second residue to the SHA during the second conversion cycle, the second residue of a third conversion cycle, the third conversion cycle being prior to the first conversion cycle, and wherein the SHA is further to utilize the second residue in the performance of the second conversion cycle.

5. The AADC of claim 4, wherein the NSE includes:
  a storage device to store the first residue and the second residue; and
  a filter to filter the first residue and the second residue to be provided to the SHA, wherein to filter the first residue includes to apply a first filtering equation for the first residue, wherein the first filtering equation is based on the first residue and a first weighting for the first residue, wherein to filter the second residue includes to apply a second filtering equation for the second residue, wherein the second filtering equation is based on the second residue and a second weighting for the second residue, wherein the second weighting is different than the first weighting, and wherein the first residue provided to the SHA is the filtered first residue and the second residue provided to the SHA is the filtered second residue.

6. The AADC of claim 1, further comprising a multiplier to:
  receive the residue; and
  multiply the residue, wherein the residue to be received by the NSE is the multiplied residue.

7. The AADC of claim 1, wherein the comparator is to output a digital representation of the sample, and wherein the AADC further comprises:
  a digital-to-analog converter (DAC) to produce an analog representation of the digital representation of the sample; and
  a summation block to subtract the analog representation from the sample to produce the residue.

8. The AADC of claim 1, wherein the SHA has a first input and a second input, wherein the AADC further includes:
  a first switch coupled between the first input of the SHA and an input of the AADC on which the analog signal is received, wherein the first switch is to be closed to sample the analog signal; and
  a second switch coupled between the NSE and the second input of the SHA, wherein the second switch is to be closed to provide the residue to the SHA.

9. A method of noise shaping by an algorithmic analog-to-digital converter (AADC), comprising:
  performing, by the AADC, a first conversion cycle for a first sample of an analog input signal;
  storing, by the AADC, a residue from the first conversion cycle; and
  applying, by the AADC, the residue as noise shaping for a second conversion cycle for a second sample of the analog input signal.

10. The method of claim 9, further comprising filtering, by the AADC, the residue, wherein the residue applied by the AADC is the filtered residue.

11. The method of claim 9, further comprising applying, by the AADC, gain compensation to the residue to be applied by the AADC, wherein a weighting of the gain compensation is dependent on a number of bit trials within the first conversion cycle.

12. The method of claim 9, further comprising:
  determining, by the AADC, whether a number of residues stored by the AADC is equal to a maximum number of residues to be stored by AADC; and
  deleting or modifying, by the AADC, a second residue from the AADC in response to a determination that the number of residues stored by the AADC is equal to the maximum number of residues, wherein the second residue is an oldest residue stored by the AADC.

13. The method of claim 9, wherein the residue is a first residue, wherein method further comprises applying, by the AADC, a second residue as the noise shaping for the second conversion cycle, wherein the second residue is from a third conversion cycle, and wherein the third conversion cycle was performed prior to the first conversion cycle.

14. The method of claim 13, further comprising:
applying, by the AADC, first gain compensation to the first residue to be applied as the noise shaping, wherein a first weighting of the first gain compensation is applied to the first residue; and
applying, by the AADC, second gain compensation to the second residue to be applied as the noise shaping, wherein a second weighting of the second gain compensation is applied to the second residue, and wherein the second weighting is different than the first weighting.

15. The method of claim 13, wherein the first residue is a most recently stored residue prior to the second conversion cycle, and wherein the second residue is a second most recently stored residue prior to the second conversion cycle.

16. A sensing device, comprising:
a sensor to sense a characteristic and output an analog signal that indicates a value of the characteristic; and
a device coupled to the sensor, the device to:
sample the analog signal to produce a first sample; and
perform an analog-to-digital conversion of the first sample with an algorithmic analog-to-digital converter (AADC) of the device, wherein to perform the analog-to-digital conversion includes to utilize a residue of a prior conversion cycle to provide noise shaping for the analog-to-digital conversion of the first sample.

17. The sensing device of claim 16, wherein the device includes a controller coupled to the AADC, wherein the controller is to:
cause a first switch of the AADC to couple an input of the device to the AADC to sample the analog signal; and
cause a second switch of the AADC to close to provide the residue for the noise shaping.

18. The sensing device of claim 16, wherein the residue is a first residue, wherein the AADC includes:
a storage device to store one or more residues from one or more conversion cycles prior to the analog-to-digital conversion of the first sample, wherein the one or more residues includes the first residue; and
a filter to filter the one or more residues, wherein the filtered one or more residues are to be utilized to provide the noise shaping for the analog-to-digital conversion of the first sample.

19. The sensing device of claim 18, wherein to filter the one or more residues includes to apply a compensation gain to the one or more residues, wherein the compensation gain includes to apply different weightings to each of the one or more residues based on numbers of conversion cycles each of the one or more residues is from the analog-to-digital conversion of the first sample.

20. The sensing device of claim 18, wherein the AADC is to:
compare a number of the one or more residues to a maximum number of residues; and
remove or modify an oldest residue of the one or more residues from the storage device in response to the number of the one or more residues is equal to the maximum number of residues.

21. An algorithmic analog-to-digital converter (AADC), comprising:
a sample-and-hold amplifier (SHA) having a first input, a second input, and an output, wherein the first input of the SHA is couplable to an input of the AADC;
a comparator having a first input, a second input, and an output, wherein the first input of the comparator is coupled to the output of the SHA, and the second input of the comparator is coupled to a comparison voltage source;
a digital-to-analog converter (DAC) having an input and an output, wherein the input of the DAC is couplable to the output of the comparator;
a summation block coupled to the output of the SHA and the output of the DAC;
a multiplier coupled to an output of the summation block;
a filter having an output couplable to the second input of the SHA; and
one or more storage devices in communication with an output of the multiplier, wherein the one or more storage devices are accessible by the filter.

22. The AADC of claim 21, wherein the second input of the SHA is couplable to the output of the multiplier.

23. The AADC of claim 21, wherein:
the output of the filter is coupled to the second input of the SHA via a first switch during a first mode when noise shaping is desired.

24. The AADC of claim 21, wherein:
the output of the multiplier is coupled to the second input of the SHA via a second switch during a second mode when noise shaping is not desired.

25. The AADC of claim 21, wherein the one or more storage devices comprises one or more capacitors.

26. The AADC of claim 21, wherein the filter is to perform noise shaping based on values of the output of the multiplier.

27. The AADC of claim 21, wherein the filter is to perform a first order operation based on a value stored in the one or more storage devices.

28. The AADC of claim 21, wherein the filter is to perform a second order operation based on two values stored in the one or more storage devices.

29. The AADC of claim 21, wherein the filter is to perform a certain order operation based on a certain number of values stored in the one or more storage devices.

30. The AADC of claim 21, wherein:
the filter is to perform a certain order operation; and
the certain order depends on a number of values stored in the one or more storage devices.

31. The AADC of claim 21, wherein:
the filter is to perform a certain order operation; and
the certain order is independent of a number of values stored in the one or more storage devices.

32. The AADC of claim 21, wherein:
the filter is to transmit filtered results at different times to the SHA; and
the SHA is to combine the filtered results.

33. The AADC of claim 21, wherein:
the filter is to transmit filtered results via multiple lines to the SHA; and
the SHA is to combine the filtered results transmitted via the multiple lines.

34. The AADC of claim 21, wherein the one or more storage devices is to store values of the output of the multiplier along with an indication of an order in which the values were stored.

* * * * *